(12) United States Patent
Tan

(10) Patent No.: US 8,754,636 B2
(45) Date of Patent: Jun. 17, 2014

(54) CLAMP METER WITH MULTIPOINT MEASUREMENT

(75) Inventor: Po-Chao Tan, New Taipei (TW)

(73) Assignee: Brymen Technology Corporation, New Taipei (TW)

( * ) Notice: Subject to any disclaimer, the term of this patent is extended or adjusted under 35 U.S.C. 154(b) by 279 days.

(21) Appl. No.: 13/314,088

(22) Filed: Dec. 7, 2011

(65) Prior Publication Data
US 2013/0147464 A1    Jun. 13, 2013

(51) Int. Cl.
*G01R 1/20* (2006.01)

(52) U.S. Cl.
USPC .......................................... 324/126; 324/149

(58) Field of Classification Search
None
See application file for complete search history.

(56) References Cited

U.S. PATENT DOCUMENTS

| | | | | |
|---|---|---|---|---|
| 5,473,244 | A * | 12/1995 | Libove et al. | 324/126 |
| 6,043,640 | A * | 3/2000 | Lauby et al. | 324/127 |
| 7,944,197 | B2 | 5/2011 | Shah et al. | |
| 2005/0184722 | A1 * | 8/2005 | Gregorec, Jr. | 324/126 |

FOREIGN PATENT DOCUMENTS

| | | |
|---|---|---|
| CN | 100432680 A | 11/2008 |
| CN | 201555885 U | 8/2010 |
| EP | 0913695 B1 | 5/2002 |
| TW | 577991 B | 3/2004 |
| TW | I293117 B | 2/2008 |
| TW | 201120457 A | 6/2011 |

OTHER PUBLICATIONS

Taiwan Official Action issued on Nov. 6, 2013.

* cited by examiner

*Primary Examiner* — Minh N Tang

(74) *Attorney, Agent, or Firm* — Chun-Ming Shih; HDLS IPR Services

(57) ABSTRACT

A clamp meter with multipoint measurement includes a current-measuring unit, an analog-to-digital converting unit, and a measuring-position judgment unit. The current-measuring unit includes a plurality of current-measuring positions calibrated according to the measuring-position judgment unit. The current-measuring unit measures the current of the current-measuring position judged by the measuring-position judgment unit.

5 Claims, 3 Drawing Sheets

CLAMP METER WITH MULTIPOINT MEASUREMENT

BACKGROUND OF THE INVENTION

1. Field of the Invention

The present invention relates to a clamp meter, and especially relates to a clamp meter with multipoint measurement.

2. Description of Prior Art

A clamp meter is a common electronic measurement apparatus similar to a multimeter. A clamp meter measures current in a conductor (for example, an electric wire) without having to make electrical connection. After a clamp meter has been manufactured, the clamp meter will be calibrated, so that the clamp meter can measure and display the magnitude of the current in a conductor more accurately.

However, there is a shortcoming in the prior art clamp meter, that is the conductor has to be arranged at the middle of the hook part of the prior art clamp meter when a user measures the current in the conductor with the prior art clamp meter (because only the middle of the hook part of the prior art clamp meter had been calibrated). Otherwise, the current in the conductor will not be measured and displayed accurately. It is very inconvenient.

SUMMARY OF THE INVENTION

In order to solve the above-mentioned problems, an object of the present invention is to provide a clamp meter with multipoint measurement.

In order to achieve the object of the present invention mentioned above, the clamp meter with multipoint measurement of the present invention includes a current-measuring unit. The current-measuring unit includes a plurality of calibrated current-measuring positions.

DETAILED DESCRIPTION OF THE INVENTION

Figure 1:
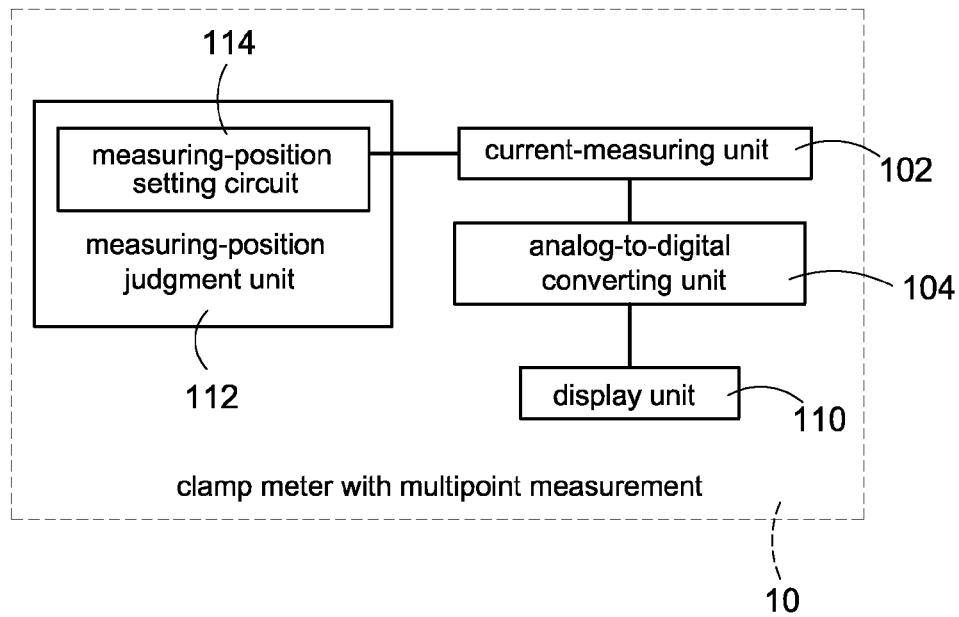
FIG. 1 shows a block diagram of an embodiment of the clamp meter with multipoint measurement of the present invention.

FIG. 1 shows a block diagram of an embodiment of the clamp meter with multipoint measurement of the present invention. A clamp meter with multipoint measurement 10 includes a current-measuring unit 102, an analog-to-digital converting unit 104, a display unit 110, and a measuring-position judgment unit 112. The measuring-position judgment unit 112 includes a measuring-position setting circuit 114.

The analog-to-digital converting unit 104 is electrically connected to the current-measuring unit 102 and the display unit 110. The measuring-position judgment unit 112 is electrically connected to the current-measuring unit 102. The measuring-position setting circuit 114 is electrically connected to the current-measuring unit 102.

Figure 3:
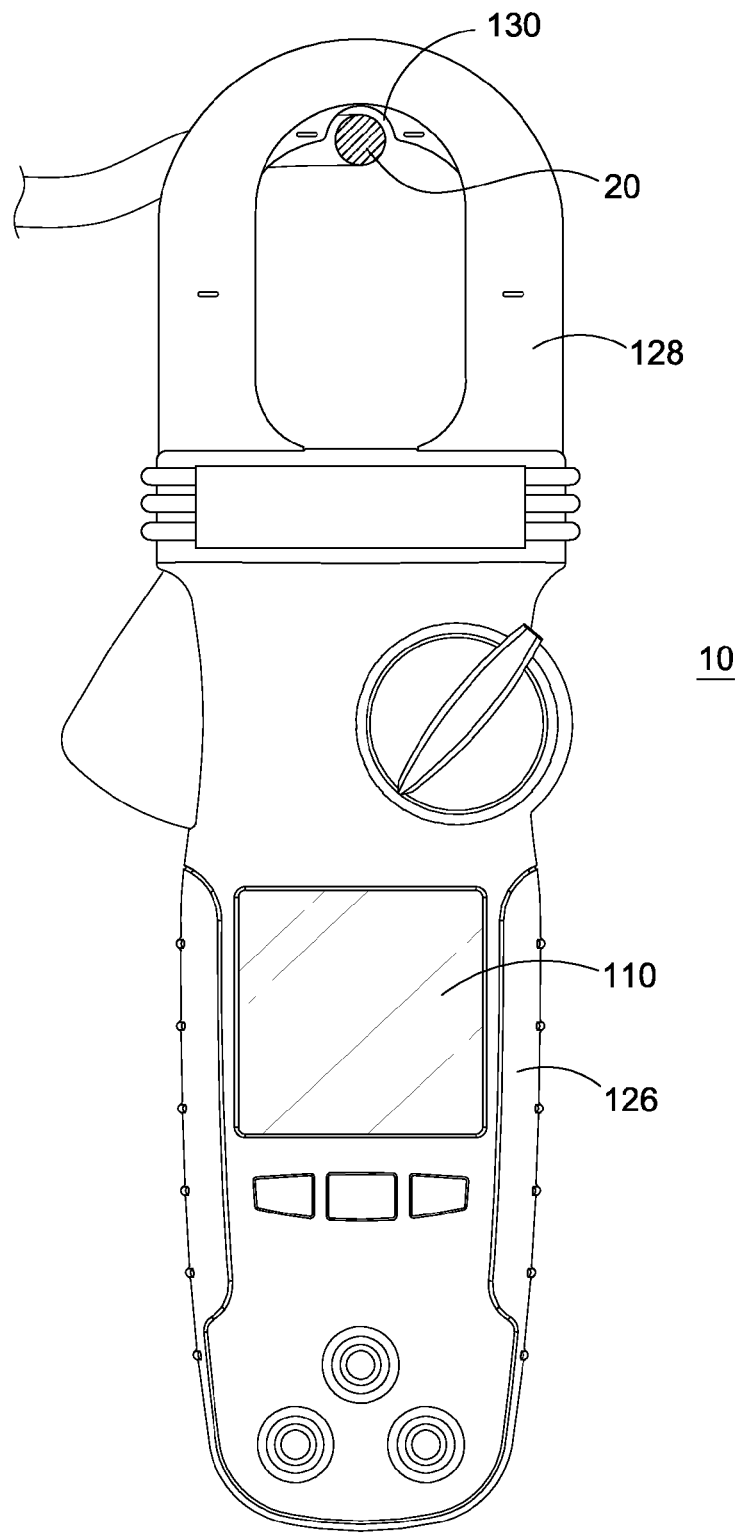
FIG. 3 shows a diagram of an embodiment of the clamp meter with multipoint measurement of the present invention.

FIG. 3 shows a diagram of an embodiment of the clamp meter with multipoint measurement of the present invention. The clamp meter with multipoint measurement 10 further includes a measurement body 126 and a hook part 128.

The analog-to-digital converting unit 104 is covered with the measurement body 126. The hook part 128 is arranged on one side of the measurement body 126. The hook part 128 includes a top valley 130 arranged at the top of the hook part 128.

Figure 4:
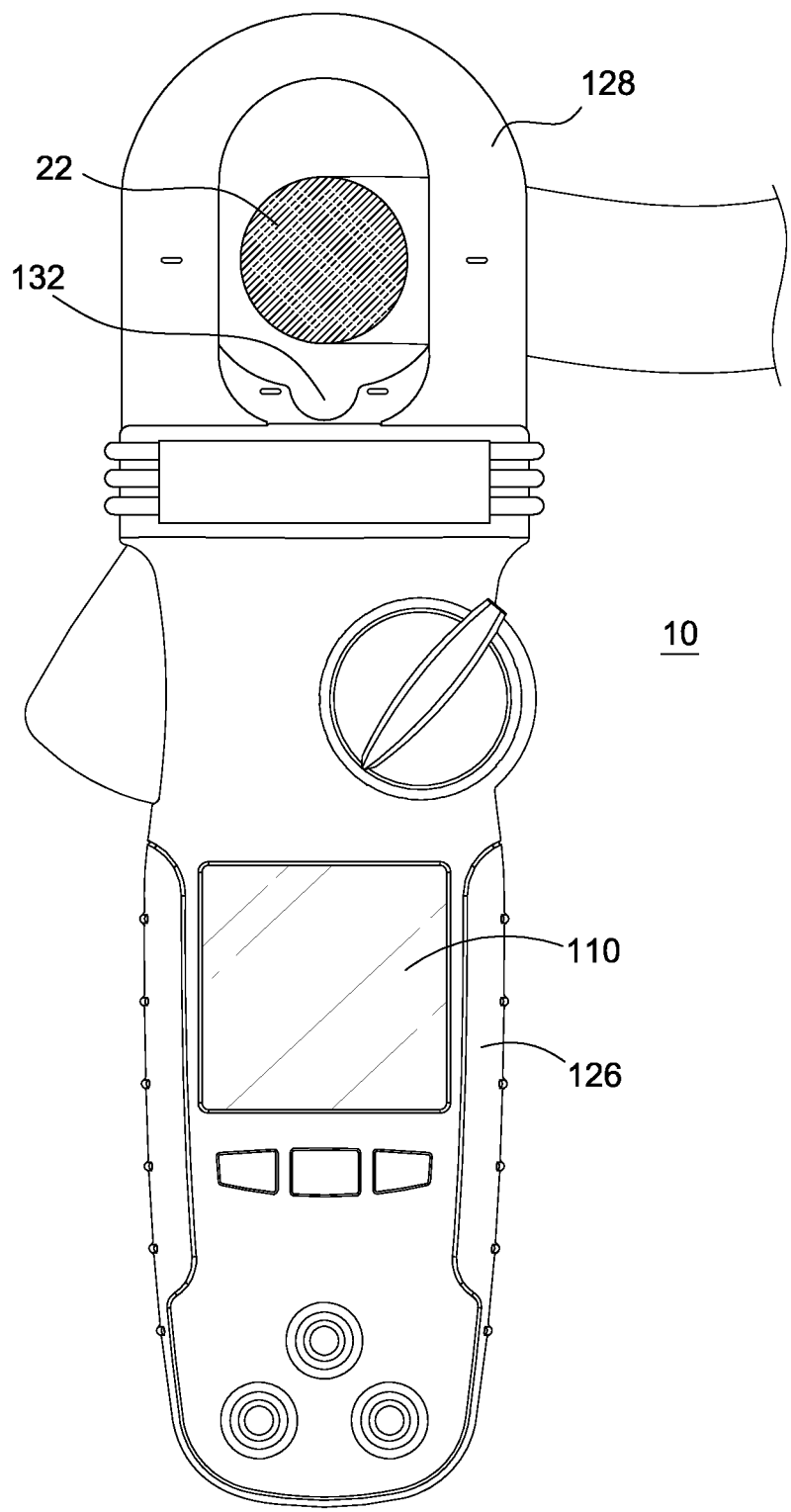
FIG. 4 shows a diagram of another embodiment of the clamp meter with multipoint measurement of the present invention.

FIG. 4 shows a diagram of another embodiment of the clamp meter with multipoint measurement of the present invention. FIG. 4 is similar to FIG. 3. The difference between FIG. 4 and FIG. 3 is that in the FIG. 4 the top valley 130 is replaced with a bottom valley 132 (arranged at the bottom of the hook part 128).

The current-measuring unit 102 includes a plurality of current-measuring positions calibrated according to the measuring-position judgment unit 112 (the measuring-position setting circuit 114). Namely, after the clamp meter with multipoint measurement 10 has been manufactured, the clamp meter with multipoint measurement 10 will be calibrated according to various current-measuring positions (for examples, the middle of the hook part 128, the top valley 130, or the bottom valley 132). The current-measuring position for the current-measuring unit 102 is set (chosen) by the measuring-position judgment unit 112 (the measuring-position setting circuit 114).

The current-measuring unit 102 measures the current of the current-measuring position judged (set or chosen) by the measuring-position judgment unit 112 (the measuring-position setting circuit 114).

The measuring-position judgment unit 112 (the measuring-position setting circuit 114) could be a switch circuit, a press-button circuit, or a knob circuit. The analog-to-digital converting unit 104 could be a fast high resolution analog-digital converter. The display unit 110 could be a display.

Figure 2:
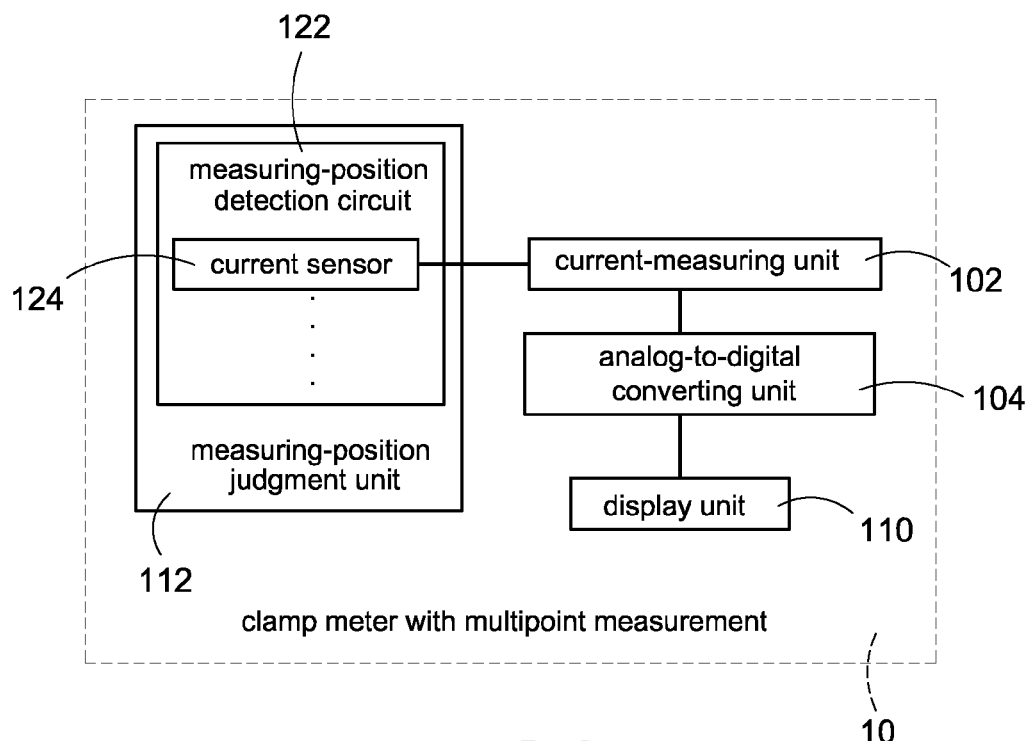
FIG. 2 shows a block diagram of another embodiment of the clamp meter with multipoint measurement of the present invention.

FIG. 2 shows a block diagram of another embodiment of the clamp meter with multipoint measurement of the present invention. A clamp meter with multipoint measurement 10 includes a current-measuring unit 102, an analog-to-digital converting unit 104, a display unit 110, and a measuring-position judgment unit 112. The measuring-position judgment unit 112 includes a measuring-position detection circuit 122. The measuring-position detection circuit 122 includes a plurality of current sensors 124.

The analog-to-digital converting unit 104 is electrically connected to the current-measuring unit 102 and the display unit 110. The measuring-position judgment unit 112 is electrically connected to the current-measuring unit 102. The measuring-position detection circuit 122 is electrically connected to the current-measuring unit 102. The current sensors 124 are electrically connected to the current-measuring unit 102.

Similarly, in FIG. 2, the current-measuring unit 102 includes a plurality of current-measuring positions calibrated according to the measuring-position judgment unit 112 (the measuring-position detection circuit 122). Namely, after the clamp meter with multipoint measurement 10 has been manufactured, the clamp meter with multipoint measurement 10 will be calibrated according to various current-measuring positions (for examples, the middle of the hook part 128, the top valley 130, or the bottom valley 132). The current-measuring position for the current-measuring unit 102 is detected and set (chosen) by the measuring-position judgment unit 112 (the measuring-position detection circuit 122).

The current-measuring unit 102 measures the current of the current-measuring position judged (detected or set or chosen)

by the measuring-position judgment unit 112 (the measuring-position detection circuit 122).

The analog-to-digital converting unit 104 could be a fast high resolution analog-digital converter. The display unit 110 could be a display.

Please refer to FIG. 3 and FIG. 4 again. The application of the present invention is to measure a first wire 20 having smaller current and diameter (as shown in the FIG. 3) at the top valley 130 or at the bottom valley 132. Therefore, the first wire 20 will be easily arranged at the correct position (at the middle of the top valley 130 or at the middle of the bottom valley 132). Another application of the present invention is to measure a second wire 22 having larger current and diameter (as shown in the FIG. 4) at the middle of the hook part 128.

There is a shortcoming in the prior art clamp meter, that is the conductor has to be arranged at the middle of the hook part of the prior art clamp meter when a user measures the current in the conductor with the prior art clamp meter, or the current in the conductor will not be measured and displayed accurately. There is no such shortcoming in the present invention. The current-measuring position could be set at the middle of the hook part, the top valley of the hook part, or the bottom valley of the hook part (or even any positions), or the conductor could be detected automatically to decide the current-measuring position. The current in the conductor could be measured and display accurately. In another embodiment, the present invention is to measure a plurality of calibrated current-measuring positions then output or display directly.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A clamp meter with multipoint measurement, including:
   a measurement body;
   a hook part arranged on one side of the measurement body, wherein the hook part includes a top valley arranged at the top of the hook part, or a bottom valley arranged at the bottom of the hook part;
   a current-measuring unit installed in the measurement body;
   an analog-to-digital converting unit installed in the measurement body and electrically connected to the current-measuring unit;
   a display unit electrically installed on the measurement body and electrically connected to the analog-to-digital converting unit; and
   a measuring-position judgment unit installed in the measurement body and electrically connected to the current-measuring unit, wherein a first wire having smaller current and diameter is placed at a first current-measuring position that is at middle of the top valley or the bottom valley, or a second wire having larger current and diameter is placed at a second current-measuring position that is at the middle of the hook part, so that the current-measuring unit measures the current of the first wire or the second wire according to the first wire being placed at the first current-measuring position, or the second wire being placed at the second current-measuring position by the measuring-position judgment unit.

2. The clamp meter with multipoint measurement in claim 1, wherein the measuring-position judgment unit includes a measuring-position setting circuit electrically connected to the current-measuring unit to set the first or the second current-measuring position.

3. The clamp meter with multipoint measurement in claim 2, wherein the measuring-position setting circuit is a switch circuit, a press-button circuit, or a knob circuit to set the first or the second current-measuring position for the current-measuring unit, and the analog-to-digital converting unit is a fast high resolution analog-digital converter, and the display unit is a display.

4. The clamp meter with multipoint measurement in claim 1, wherein the measuring-position judgment unit includes a measuring-position detection circuit electrically connected to the current-measuring unit to determine the first or the second current-measuring position.

5. The clamp meter with multipoint measurement in claim 4, wherein the measuring-position detection circuit includes a plurality of current sensors electrically connected to the current-measuring unit.

\* \* \* \* \*